United States Patent [19]
Adomi et al.

[11] Patent Number: 5,597,761
[45] Date of Patent: Jan. 28, 1997

[54] SEMICONDUCTOR LIGHT EMITTING DEVICE AND METHODS OF MANUFACTURING IT

[75] Inventors: Keizo Adomi; Nobuhiko Noto; Akio Nakamura; Takao Takenaka, all of Annaka, Japan

[73] Assignee: Shin-Etsu Handotai Co Ltd, Tokyo, Japan

[21] Appl. No.: 402,487

[22] Filed: Mar. 10, 1995

Related U.S. Application Data

[62] Division of Ser. No. 216,278, Mar. 23, 1994, Pat. No. 5,442,201.

[30] Foreign Application Priority Data

Mar. 25, 1993 [JP] Japan ..................... 5-090736

[51] Int. Cl.$^6$ ................................. H01L 21/208
[52] U.S. Cl. ..................... 437/127; 437/129; 437/126
[58] Field of Search ..................... 437/127, 129, 437/133, 126

[56] References Cited

U.S. PATENT DOCUMENTS 4,494,237  1/1985  Di Forte Poisson et al. ............ 372/45
5,401,684  3/1995  Yamada et al. ...................... 437/127

OTHER PUBLICATIONS

Matloubian et al in "Jr. Electronic Materials vol. 14(5) 1985, pp. 633–644", MOCVD epitaxial growth . . . .
Kobayashi et al in "Electronics Letters Oct. 1984, pp. 887–888", Improved 2 Deg Mobility . . . .

Primary Examiner—R. Bruce Breneman
Assistant Examiner—Mara Ronda
Attorney, Agent, or Firm—Ronald R. Snider

[57] ABSTRACT

An epitaxial layer(s) of compound semiconductor alloy doped with nitrogen and represented by the formula $(Al_xGa_{1-x})_yIn_{1-y}P$ ($0<x\leq1$, $0<y\leq1$) is formed on a compound semiconductor single crystal substrate composed of an element(s) from Group III and an element(s) from Group V in the periodic table by means of the metalorganic vapor phase epitaxy method (MOVPE method), while controlling the amount of the organic aluminum compound introduced. The organic aluminum compound is, for example, trimethyl aluminum (TMAl). The nitrogen-doped epitaxial layer is, for example, an active layer composed of said compound semiconductor alloy which has a band gap of 2.30 eV or larger and also has an alloy composition of an indirect transition area or similar to it.

4 Claims, 3 Drawing Sheets

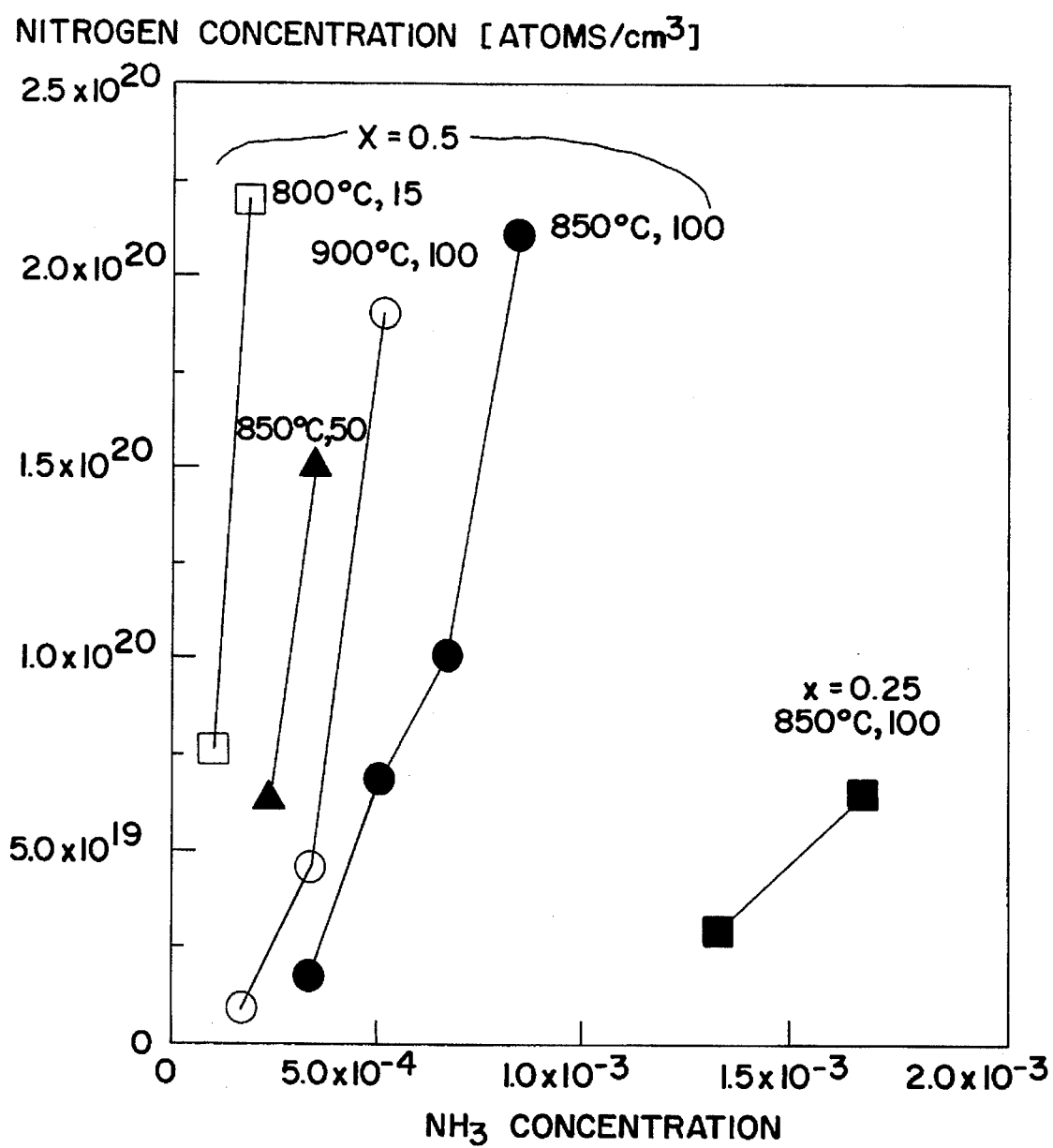
F I G. 4

SEMICONDUCTOR LIGHT EMITTING DEVICE AND METHODS OF MANUFACTURING IT

This is a division of Application Ser. No. 08/216,278 filed Mar. 23, 1994, now issued as U.S. Pat. No. 5,442,201.

BACKGROUND OF THE INVENTION

1. Field of the Invention

This invention relates to a semiconductor light emitting device and methods of manufacturing it, and more precisely to a semiconductor light emitting device which gives a pure green light emission at a high brightness and methods of manufacturing it.

2. The Prior Art

Semiconductor light emitting devices, such as light emitting diodes, are obtained by growing a plurality of semiconductor layers on the front surface of a semiconductor substrate to fabricate a multi-layer semiconductor structure with a p-n junction(s) and then cutting it into an element(s). Among them, green light emitting semiconductor devices are obtained by forming one or more layers of both n-type and p-type GaP one after another on an n-type GaP single crystal substrate and cutting it into elements for practical use.

However, since GaP has an indirect transition-type band structure, the light emission efficiency is not sufficient even if the p-n junction(s) is formed, resulting in a light emitting device with a very low brightness. Because of this, the incorporation of isoelectronic traps which function as light emitting centers is performed as an effective means to improve the light emitting efficiency. For example, nitrogen (N) is doped to the GaP layer(s) near the p-n junction to substitute P sites in order to improve the light emitting efficiency. A GaP-type light emitting device thus doped with nitrogen emits a yellowish-green light with a peak wavelength of approximately 567

Research of GaP semiconductor light emitting devices has a nm. long history, and the light emitting efficiency of the GaP semiconductor light emitting devices has been improved to the limit of the material property. However, it has been a problem that a sufficient light emitting efficiency could not be achieved because, as mentioned above, GaP essentially had an indirect transition-type band structure. Although the nitrogen doped GaP-type light emitting devices improved the light emitting efficiency, since the energy level of nitrogen was formed within the GaP band gap, it has been a problem that the light emitting wavelength became longer and the color changed to yellowish-Green, and thus a pure green light could not be obtained.

BRIEF SUMMARY OF THE INVENTION

Therefore, the object of this invention is to provide a semiconductor light emitting device which Gives a pure green light emission with a high brightness, and methods of manufacturing it.

In this invention, in order to achieve the object described above, an epitaxial layer(s) of compound semiconductor alloy doped with nitrogen and represented by the formula $(Al_xGa_{1-x})_yIn_{1-y}P$ ($0<x\leq 1$, $0<y\leq 1$) is formed on a compound semiconductor single crystal substrate composed of an element(s) from Group III and an element(s) from Group V in the periodic table by means of the metalorganic vapor phase epitaxy method (MOVPE method), while controlling the amount of the organic aluminum compound introduced. Said organic aluminumcompound is, for example, trimethyl aluminum (TMAl). If said nitrogen-doped epitaxial layer is an active layer composed of said compound semiconductor alloy which has a band gap of 2.30 eV or larger and also has an alloy composition of an indirect transition area or similar to it, then this layer can be used as an active layer which emits a pure green light with a high-brightness.

The inventors have discovered that the compound semiconductor alloy, represented by the formula $(Al_xGa_{1-x})_yIn_{1-y}P$ ($0<x\leq 1$, $0<y\leq 1$), can be efficiently doped with nitrogen by means of the MOVPE method if the amount of the organic aluminum compound introduced is controlled. We have also discovered that a pure green light emission whose wavelength is 555 nm can be obtained by forming an active layer formed by nitrogen doping to $(Al_xGa_{1-x})_yIn_{1-y}P$ which has a band gap of 2.30 eV or larger and also has an alloy composition of an indirect transition area or similar to it. Experiments conducted by the inventors showed that nitrogen functions as an effective isoelectronic trap(s) even in $(Al_xGa_{1-x})_yIn_{1-y}P$. Although the emission through the mediation of nitrogen has a longer wavelength compared with the band-to-band light emission of $(Al_xGa_{1-x})_yIn_{1-y}P$, the light emission wavelength remains in the pure green range if the band gap is 2.30 eV or larger. Furthermore, the light emission efficiency is much higher than that of conventional GaP-type light emitting devices, ensuring a sufficiently high brightness.

When $NH_3$ is used as a nitrogen doping source, the presence of organic aluminum is considered to contribute to efficient nitrogen doping, allowing a higher amount of nitrogen doped.

BRIEF DESCRIPTION OF THE DRAWINGS

FIG. 4 is a figure which shows the nitrogen concentrations in the active layer with various growth conditions of the active layer.

DETAILED DESCRIPTION

A detailed example of the semiconductor light emitting device of this invention and the method of manufacturing it is described below. In this example, a case of growing $Al_xGa_{1-x}P$ on the GaP substrate is chosen for explanation as the simplest case, which occurs when y=1 in $(Al_xGa_{1-x})_yIn_{1-y}P$.

For the method of growing the $Al_xGa_{1-x}P$ layer on the GaP substrate, the MOVPE method is adopted. As the material source for Al, Ga and P, trimethyl aluminum (TMAl), trimethyl gallium (TMGa) and phosphine ($PH_3$), are used respectively. As the nitrogen source, $NH_3$ is used because the highest purity can be obtained. As the n-type and p-type dopant sources, hydrogen selenide ($H_2Se$) and dimethyl zinc (DMZn), are used respectively.

Figure 1:
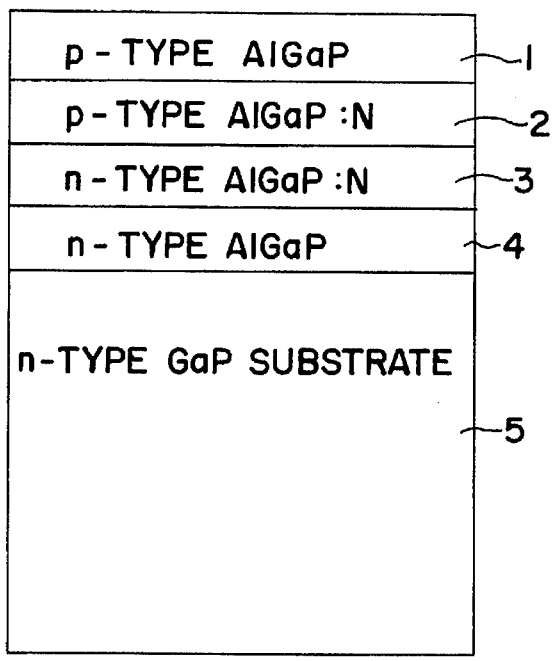
FIG. 1 is a schematic cross section of a semiconductor light emitting device of one example of this invention.

FIG. 1 is a schematic cross section of a semiconductor light emitting device of one example of this invention. This light emitting device is fabricated by growing an n-type AlGaP layer 4, an N-doped n-type AlGaP layer 3, an N-doped p-type AlGaP layer 2 and a p-type AlGaP layer 1, in the order given above, on an n-type GaP substrate 5 by means of the MOVPE method.

Figure 2:
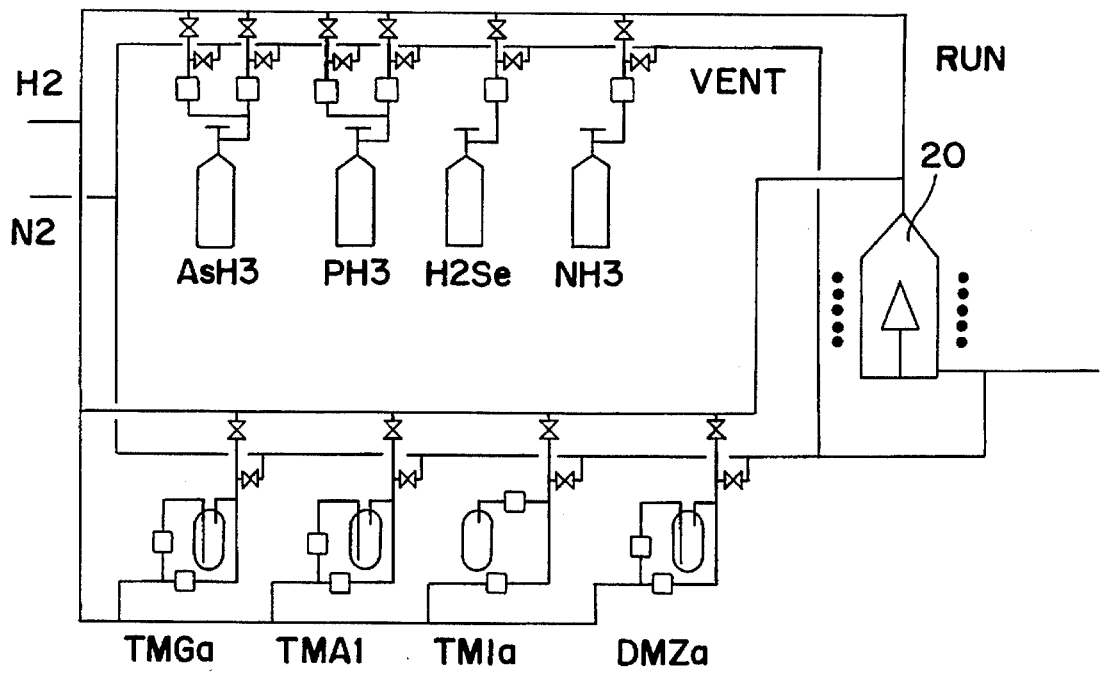
FIG. 2 is an illustration which shows an example of the growth apparatus used in the MOVPE method.

When the MOVPE method is used to implement the growth, a growth apparatus with the configuration shown in FIG. 2, for example, is used. A mixed gas of various vapors of metalorganic compounds of Group III elements, a hydride gas of Group V element and ammonia are fed into a process tube 20, with partial pressures and flow rates adjusted according to the composition of the growing layer, and the desired layers are formed one after another on the n-type GaP substrate 5 which is placed in the process tube 20.

Specifically, in a barrel-type MOVPE growth apparatus, under a 50 Torr vacuum, the n-type AlGaP layer 4 is formed on the n-type GaP substrate 5 which has a diameter of 50 mm and a crystal orientation of (100), by supplying, mixed source gases prepared in such a way that the supply ratio of the Group V element(s) and the Group III element(s) (V/III ratio) is 100, under the following growth conditions: a growth temperature of 850° C. and a growth rate of approximately 4 micrometers/hour. Then, $NH_3$ is fed under these growth conditions to form the N-doped n-type AlGaP layer 3. Next, the N-doped p-type AlGaP layer 2, and finally the p-type AlGaP layer 1 are formed. A P-type GaP layer may be formed on top of these layers to prevent oxidation. The structure shown in FIG. 1 is thus obtained and cut into elements to obtain light emitting devices such as light emitting diodes.

Next, the nitrogen doping characteristics are investigated. During the growth of the N-doped AlGaP layer, the concentration ratio of $NH_3$ in the mixed gases is varied while the other growth conditions are held constant to determine the changes of nitrogen doping amount in the AlGaP layer.

Figure 3:
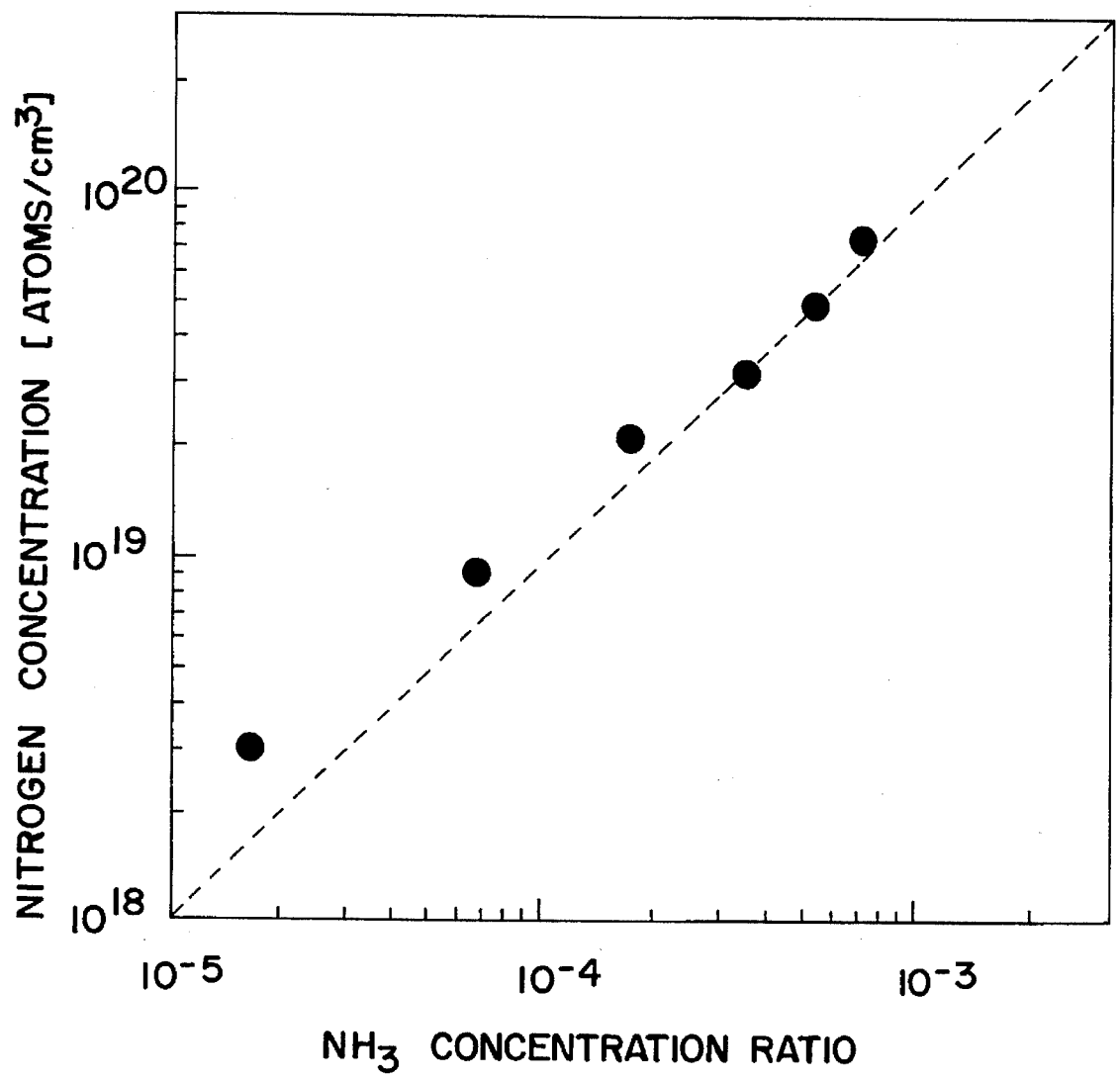
FIG. 3 is a figure which shows the relationship between the $NH_3$ concentration ratio in the reaction gas during the active layer growth and the nitrogen concentration in the active layer.

FIG. 3 shows the relationship between the $NH_3$ concentration ratio and the nitrogen concentration in the AlGaP layer. As shown in FIG. 3, they are highly correlated. This indicates that the nitrogen doping amount in the AlGaP layer can be controlled by adjusting the $NH_3$ concentration ratio. It is also found that the single crystal state can be maintained while doping the nitrogen, when the $NH_3$ concentration ratio is equal to or lower than the critical concentration ratio corresponding to each growth condition. When the concentration is higher than the critical concentration ratio, AlN with a wultzite structure is formed and the epitaxial layer becomes polycrystalline.

Next, the AlGaP layer is grown under various conditions, and the changes of the nitrogen concentration in the AlGaP layer are studied. The results are shown in FIG. 4. In this figure, each of the growth conditions for the measurement points represented by the each symbol is shown in table 1.

FIG. 4 indicates that the larger AlP molar ratio x of the alloy $Al_xGa_{1-x}P$ tends to have higher nitrogen concentration in the AlGaP layer when the $NH_3$ concentration is the same, resulting in more efficient nitrogen doping, if other conditions are identical. In other words, if $NH_3$ is used as a N source, we believe an adduct (TMAl : $NH_3$) is formed between $NH_3$ and TMAl and the chemical bonding between Al and N plays an important role when N is doped in AlGaP. In fact, it is extremely hard to dope nitrogen in GaP when the GaP is being formed by the MOVPE method without the presence of TMAl.

FIG. 4 also indicates shows that a higher growth temperature and a lower V/III ratio help efficient nitrogen doping.

TABLE 1

| MEASURE-<br>MENT<br>POINT | AlP MOLAR<br>RATIO x | GROWTH<br>TEMPERATURE<br>(°C.) | V/III<br>RATIO |
|---|---|---|---|
| □ | 0.5 | 800 | 15 |
| ▲ | 0.5 | 850 | 50 |
| ○ | 0.5 | 900 | 100 |
| ● | 0.5 | 850 | 100 |
| ■ | 0.25 | 850 | 100 |

Table 2 compares the light emitting device of this example which has a nitrogen-doped AlGaP layer(s) with those of conventional light emitting devices about some characteristics.

TABLE 2

| LIGHT<br>EMITTING<br>DEVICE | LIGHT<br>EMISSION<br>WAVELENGTH<br>(nm) | EXTERNAL<br>QUANTUM<br>EFFICIENCY<br>(%) | VISUAL<br>EFFI-<br>CIENCY<br>(1 m/W) |
|---|---|---|---|
| GaP | 555 | 0.08 | 0.54 |
| GaP: N | 567 | 0.4 | 2.4 |
| AlGaP: N | 555 | 0.24 | 1.62 |

This example, as shown in table 2, provides a pure green light emission wavelength 555 nm, which is the same as that of the GaP light emitting device with no nitrogen doping. The external quantum efficiency and the visual efficiency, which are indicators of brightness, have improved drastically over the GaP light emitting device with no nitrogen doping, and are comparable to the values of the nitrogen-doped GaP light emitting device.

In this example, the case of growing $Al_xGa_{1-x}P$ on a GaP substrate is chosen as an example. However, it is also possible to grow lattice-matched $(Al_xGa_{1-x})_yIn_{1-y}P$ on the GaAs substrate. While these examples use $NH_3$ as the nitrogen source, other nitrogen compounds, such as trimethyl amine or dimethyl hydrazine can also be used. The MOVPE method is used as the epitaxial growth method, but we believe other methods such as the CBE method (chemical beam exitaxial method) can also be used.

As the material sources for Al, Ga and P, trimethyl aluminum (TMAl), trimethyl gallium (TMGa) and phosphine ($PH_3$) are used respectively. As the n-type and p-type dopants, hydrogen selenide ($H_2Se$) and dimethyl zinc (DMZn) are used respectively. However, needless to say, other material sources than these can also be used.

In this example, a case of homo junctions of AlGaP is described. However, it is also possible to achieve the carrier confinement effect utilizing hetero junctions by adjusting the alloy ratios of the n-type and p-type AlGaP layers 1 and 4 adjacent to 3 the N-doped n-type and p-type AlGaP layers 2 and 3 achieve the carrier confinement effect utilizing hetero junctions.

As described thus far, this invention makes it possible to obtain a semiconductor light emitting device which gives a highbrightness pure green light emission.

We claim:

1. A method of manufacturing a semiconductor light emitting device having an epitaxial layer(s) of compound semiconductor alloy doped with nitrogen and represented by the formula $(Al_xGa_{1-x})_yIn_{1-y}P$ ($0<x\leq1$, $0<y\leq1$), comprising the steps of forming said device on a compound semiconductor single crystal substrate composed of an element(s) from Group III and an element(s) from Group V in the periodic table by means of the metal organic vapor phase epitaxy method (MOVPE method), and controlling efficiency of nitrogen doping in the epitaxial layer(s) of compound semiconductor alloy by an amount of organic aluminum compound introduced.

2. A method of manufacturing a semiconductor light emitting device as described in claim 1, wherein said organic aluminum compound is trimethyl aluminum (TMAl).

3. A method of manufacturing a semiconductor light emitting device as described in claim 1, wherein ammonia is used as the nitrogen source.

4. A method of manufacturing a semiconductor light emitting device as described in claim 1, wherein ammonia is used as the nitrogen source.

* * * * *